(12) United States Patent
Harigai et al.

(10) Patent No.: US 8,998,390 B2
(45) Date of Patent: Apr. 7, 2015

(54) PIEZOELECTRIC FILM, INK JET HEAD, METHOD OF FORMING IMAGE BY THE INK JET HEAD, ANGULAR VELOCITY SENSOR, METHOD OF MEASURING ANGULAR VELOCITY BY THE ANGULAR VELOCITY SENSOR, PIEZOELECTRIC GENERATING ELEMENT, AND METHOD OF GENERATING ELECTRIC POWER USING THE PIEZOELECTRIC GENERATING ELEMENT

(71) Applicant: Panasonic Corporation, Osaka (JP)

(72) Inventors: Takakiyo Harigai, Osaka (JP); Yoshiaki Tanaka, Nara (JP); Hideaki Adachi, Osaka (JP); Eiji Fujii, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/026,991

(22) Filed: Sep. 13, 2013

(65) Prior Publication Data

US 2014/0011051 A1    Jan. 9, 2014

Related U.S. Application Data

(63) Continuation of application No. PCT/JP2013/001195, filed on Feb. 28, 2013.

(30) Foreign Application Priority Data

Mar. 6, 2012 (JP) .................. 2012-048760
Mar. 6, 2012 (JP) .................. 2012-048762
Jul. 30, 2012 (JP) .................. 2012-167968

(51) Int. Cl.
*B41J 2/045* (2006.01)
*H02N 2/00* (2006.01)
(Continued)

(52) U.S. Cl.
CPC .......... *H01L 41/1871* (2013.01); *H01L 41/187* (2013.01); *B41J 2/14233* (2013.01);
(Continued)

(58) Field of Classification Search
USPC ........... 347/70, 71, 72; 310/311, 323.06, 357, 310/363; 252/62.9 PZ
See application file for complete search history.

(56) References Cited

U.S. PATENT DOCUMENTS 7,323,806 B2 *   1/2008   Shibata et al. ................. 310/358
7,870,878 B2     1/2011   Zhevago et al.
(Continued)

FOREIGN PATENT DOCUMENTS

CN    101981718 A    2/2011
CN    102113145 A    6/2011
(Continued)

OTHER PUBLICATIONS

Abrahams, S.C., "Systematic prediction of new inorganic ferroelectrics in point group 4," Acta Crystallographica, Section B: Structural Science (1999), Munksgaard Int'l Pub., Ltd., p. 494-506.*

(Continued)

*Primary Examiner* — Matthew Luu
*Assistant Examiner* — Patrick King
(74) *Attorney, Agent, or Firm* — McDermott Will & Emery LLP

(57) ABSTRACT

Provided is an NBT-BT lead-free piezoelectric film having a high crystalline orientation and a high piezoelectric constant. The present invention is a piezoelectric film comprising a $Na_xM_{1-x}$ layer and a $(Bi, Na)TiO_3$—$BaTiO_3$ layer. The $(Bi, Na)TiO_3$—$BaTiO_3$ layer is formed on the $Na_xM_{1-x}$ layer, where M represents Pt, Ir, or PtIr and x represents a value of not less than 0.002 and not more than 0.02. Both of the $Na_xM_{1-x}$ layer and the $(Bi, Na)TiO_3$—$BaTiO_3$ layer have a (001) orientation only, a (110) orientation only, or a (111) orientation only.

3 Claims, 11 Drawing Sheets

(51) Int. Cl.

| | | |
|---|---|---|
| *H01L 41/187* | (2006.01) | |
| *B41J 2/14* | (2006.01) | |
| *H01L 41/047* | (2006.01) | |
| *H01L 41/08* | (2006.01) | |
| *H01L 41/319* | (2013.01) | |
| *G01C 19/56* | (2012.01) | |
| *H01L 41/113* | (2006.01) | |
| *G01C 19/5769* | (2012.01) | |

(52) U.S. Cl.
CPC ......... *B41J2202/03* (2013.01); *H01L 41/0477* (2013.01); *H01L 41/0478* (2013.01); *H01L 41/081* (2013.01); *H01L 41/319* (2013.01); *B41J 2/14201* (2013.01); *G01C 19/56* (2013.01); *H01L 41/113* (2013.01); *G01C 19/5769* (2013.01)

(56) References Cited

U.S. PATENT DOCUMENTS

| | | | |
|---|---|---|---|
| 2007/0138459 A1* | 6/2007 | Wong et al. | 257/9 |
| 2007/0209572 A1* | 9/2007 | Hansen et al. | 117/11 |
| 2010/0194245 A1* | 8/2010 | Harigai et al. | 310/363 |
| 2010/0289383 A1 | 11/2010 | Harigai et al. | |
| 2011/0143146 A1* | 6/2011 | Harigai et al. | 428/446 |
| 2011/0175012 A1* | 7/2011 | Harigai et al. | 252/62.9 PZ |
| 2012/0038714 A1 | 2/2012 | Harigai et al. | |
| 2012/0038715 A1 | 2/2012 | Harigai et al. | |
| 2012/0280165 A1 | 11/2012 | Harigai et al. | |
| 2012/0280599 A1 | 11/2012 | Harigai et al. | |
| 2012/0281046 A1 | 11/2012 | Harigai et al. | |
| 2013/0222485 A1 | 8/2013 | Harigai et al. | |

FOREIGN PATENT DOCUMENTS

| | | |
|---|---|---|
| JP | 04-60073 B2 | 9/1992 |
| JP | 4455678 B1 | 4/2010 |
| WO | 2010-047049 A1 | 4/2010 |
| WO | 2010-122707 A1 | 10/2010 |
| WO | 2011-129072 A1 | 10/2011 |
| WO | 2011-158490 A1 | 12/2011 |
| WO | 2011-158491 A1 | 12/2011 |
| WO | 2011-158492 A1 | 12/2011 |
| WO | 2012-001942 A1 | 1/2012 |

OTHER PUBLICATIONS

International Search Report issued in PCT/2013/001195, dated May 14, 2013.

English Translation of Chinese Search Report dated Dec. 3, 2014 for the related Chinese Patent Application No. 201380000872.1.

* cited by examiner

PIEZOELECTRIC FILM, INK JET HEAD, METHOD OF FORMING IMAGE BY THE INK JET HEAD, ANGULAR VELOCITY SENSOR, METHOD OF MEASURING ANGULAR VELOCITY BY THE ANGULAR VELOCITY SENSOR, PIEZOELECTRIC GENERATING ELEMENT, AND METHOD OF GENERATING ELECTRIC POWER USING THE PIEZOELECTRIC GENERATING ELEMENT

This is a continuation of International Application No. PCT/JP2013/001195, with an international filing date of Feb. 28, 2013, which claims priorities of Japanese Patent Application No. 2012-048762, filed on Mar. 6, 2012, Japanese Patent Application No. 2012-048760, filed on Mar. 6, 2012, and Japanese Patent Application No. 2012-167968, filed on Jul. 30, 2012, the contents of which are hereby incorporated by reference.

BACKGROUND OF THE INVENTION

1. Field of the Invention

The present invention relates to a piezoelectric film comprising a piezoelectric layer. The present invention further relates to an ink jet head comprising the piezoelectric film and a method for forming an image by the head, to an angular velocity sensor comprising the piezoelectric film and a method for measuring an angular velocity by the sensor, and to a piezoelectric generating element comprising the piezoelectric film and a method for generating electric power using the element.

2. Description of the Related Art

As disclosed in Japanese Patent Publication No. Hei 4-60073B and U.S. Pat. No. 7,870,787, perovskite-type composite oxide $(1-y)(Bi, Na) TiO_3 - yBaTiO_3$ has been recently researched and developed as a lead-free piezoelectric material. This piezoelectric material is referred to as "NBT-BT". The value of y falls within the range of not less than 0.03 and not more than 0.15.

SUMMARY OF THE INVENTION

An object of the present invention is to provide an NBT-BT lead-free piezoelectric film having a high crystalline orientation and a high ferroelectric property.

It is another object of the present invention to provide an ink jet head, an angular velocity sensor, and a piezoelectric generating element, each comprising the lead-free piezoelectric film. It is still another object of the present invention to provide a method for forming an image by this ink jet head, a method for measuring an angular velocity by this angular velocity sensor, and a method for generating electric power using this piezoelectric generating element.

The present invention is a piezoelectric film comprising:

an $Na_xM_{1-x}$ layer; and a $(Bi, Na)TiO_3$—$BaTiO_3$ layer; wherein the $(Bi, Na) TiO_3$—$BaTiO_3$ layer is formed on the $Na_xM_{1-x}$ layer, M represents Pr, Ir, or PtIr, x represents a value of not less than 0.002 and not more than 0.02, and both of the $Na_xM_{1-x}$ layer and the $(Bi, Na) TiO_3$—$BaTiO_3$ layer have a (001) orientation only, a (110) orientation only, or a (111) orientation only.

The $(Bi, Na) TiO_3$—$BaTiO_3$ layer may be in contact with the $Na_xM_{1-x}$ layer.

The $(Bi, Na) TiO_3$—$BaTiO_3$ layer further may contain Mn.

An ink jet head comprising the piezoelectric film and a method for forming an image by this ink jet head is included in the spirits of the present invention.

An angular velocity comprising the piezoelectric film and a method for measuring an angular velocity by this angular velocity sensor is included in the spirits of the present invention.

A piezoelectric generating element comprising the piezoelectric film and a method for generating electric power using this piezoelectric generating element is included in the spirits of the present invention.

The present invention provides an NBT-BT lead-free piezoelectric film having a high crystalline orientation and a high piezoelectric constant.

The present invention provides an ink jet head comprising the lead-free piezoelectric film, and a method for forming an image by this ink jet head.

The present invention provides an angular velocity sensor comprising the lead-free piezoelectric film, and a method for measuring an angular velocity by this angular velocity sensor.

The present invention provides a piezoelectric generating element comprising the lead-free piezoelectric film, and a method for generating electric power using this piezoelectric generating element.

DETAILED DESCRIPTION OF THE INVENTION

Figure 1A:
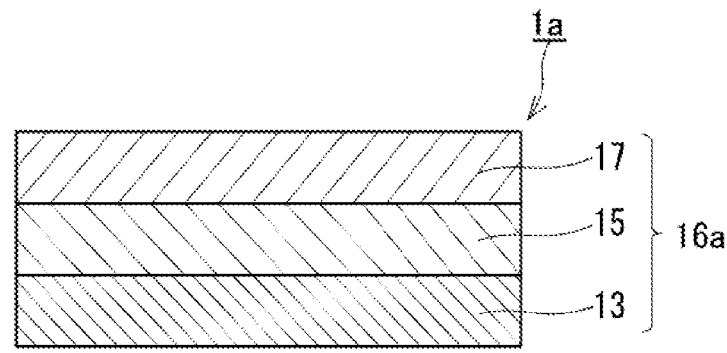
FIG. 1A shows a cross-sectional view of a piezoelectric film according to an embodiment.

An embodiment of the present invention is described below with reference to the drawings. In the following description, the same reference numerals are used to designate the same elements and parts, and therefore the overlapping description thereof can be omitted.

FIG. 1A shows a piezoelectric film according to the embodiment. The piezoelectric film 1a shown in FIG. 1A has a multilayer structure 16a. This multilayer structure 16a comprises a $Na_xM_{1-x}$ layer 13 and a (Bi, Na)$TiO_3$—$BaTiO_3$ layer 15. The $Na_xM_{1-x}$ layer 13 serves as a first electrode layer. The multilayer structure 16a further comprises a second electrode layer 17. The (Bi, Na) $TiO_3$—$BaTiO_3$ layer 15 is interposed between the first electrode layer 13 and the second electrode layer 17. The first electrode layer 13 and the second electrode layer 17 are used to apply a voltage to the (Bi, Na) $TiO_3$—$BaTiO_3$ layer 15.

Both of the $Na_xM_{1-x}$ layer 13 and the (Bi, Na)$TiO_3$—$BaTiO_3$ layer 15 have a (001) orientation only, a (110) orientation only, or a (111) orientation only. In more detail, the $Na_xM_{1-x}$ layer 13 has a (001) orientation only, a (110) orientation only, or a (111) orientation only. Similarly, the (Bi, Na)$TiO_3$—$BaTiO_3$ layer 15 has a (001) orientation only, a (110) orientation only, or a (111) orientation only. Furthermore, the $Na_xM_{1-x}$ layer 13 has the same orientation as the (Bi, Na)$TiO_3$—$BaTiO_3$ layer 15.

In other words, in a case where the $Na_xM_{1-x}$ layer 13 has a (001) orientation only, the (Bi, Na)$TiO_3$—$BaTiO_3$ layer 15 also has a (001) orientation only. In a case where the $Na_xM_{1-x}$ layer 13 has a (001) orientation only, the (Bi, Na)$TiO_3$—$BaTiO_3$ layer 15 does not have other orientations such as a (110) orientation and a (111) orientation. See the example A, which is described later.

Similarly, in a case where the $Na_xM_{1-x}$ layer 13 has a (110) orientation only, the (Bi, Na)$TiO_3$—$BaTiO_3$ layer 15 also has a (110) orientation only. In a case where the $Na_xM_{1-x}$ layer 13 has a (110) orientation only, the (Bi, Na)$TiO_3$—$BaTiO_3$ layer 15 does not have another orientation such as a (001) orientation or a (111) orientation. See the example B, which is described later.

In a case where the $Na_xM_{1-x}$ layer 13 has a (111) orientation only, the (Bi, Na)$TiO_3$—$BaTiO_3$ layer 15 also has a (111) orientation only. In a case where the $Na_xM_{1-x}$ layer 13 has a (111) orientation only, the (Bi, Na)$TiO_3$—$BaTiO_3$ layer 15 does not have other orientations such as a (001) orientation and a (110) orientation. See the example C, which is described later.

The metal "M" contained in the $Na_xM_{1-x}$ layer 13 represents Pt, Ir, or PtIr.

The character "x" represents a value of not less than 0.002 and not more than 0.02. When the value of x is less than 0.002, the crystalline orientation and the piezoelectric constant are low. See the comparative example A1, the comparative example A3, the comparative example B1, and the comparative example C1, which are described later.

When the value of x is more than 0.02, the crystalline orientation and the piezoelectric constant are low. See the comparative example A2, the comparative example A4, the comparative example B2, and the comparative example C2, which are described later.

It is desirable that these stacked layers 13 and 15 be in contact with each other. The (Bi, Na) $TiO_3$—$BaTiO_3$ layer 15 functions as a piezoelectric layer. The (Bi, Na) $TiO_3$—$BaTiO_3$ layer 15 has a high crystalline orientation and a high piezoelectric constant, although it does not contain lead. The (Bi, Na) $TiO_3$—$BaTiO_3$ layer 15 has the same piezoelectric performance as a PZT layer.

The $Na_xM_{1-x}$ layer 13 may be typically formed by a sputtering method. The $Na_xM_{1-x}$ layer 13 may also be formed by a thin film formation method such as pulsed laser deposition (PLD), chemical vapor deposition (CVD), sol-gel processing, or aerosol deposition (AD).

The thickness of the $Na_xM_{1-x}$ layer 13 is not limited. As one example, the thickness of the $Na_xM_{1-x}$ layer 13 is not less than about 2 nanometers.

The thickness of the (Bi, Na)$TiO_3$—$BaTiO_3$ layer 15 is not limited, either. For example, the thickness of the (Bi, Na)$TiO_3$—$BaTiO_3$ layer 15 is not less than 0.5 micrometers and not more than 10 micrometers.

The (Bi, Na)$TiO_3$—$BaTiO_3$ layer 15 has a perovskite-type crystal structure represented by the chemical formula $ABO_3$. The A site is Bi, Na, and Ba. The B site is Ti. The (Bi, Na)$TiO_3$—$BaTiO_3$ layer 15 may contain a minute amount of impurities. The impurities typically may be Li and K to substitute for Na, and Sr and Ca to substitute for Ba, in the A site. The impurities typically may be Zr to substitute for Ti in the B site. Examples of the other impurities may include Mn, Fe, Nb, and Ta. Some of these impurities can improve the crystallinity and piezoelectric performance of the (Bi, Na)$TiO_3$—$BaTiO_3$ layer 15.

The (Na, Bi) $TiO_3$—$BaTiO_3$ layer 15 may contain other perovskite-type crystals. Examples of this crystal include $BiFeO_3$, $BiCoO_3$, Bi (Zn, Ti) $O_3$, Bi (Mg, Ti) $O_3$, $LiNbO_3$, $NaNbO_3$, and $KNbO_3$. This crystal may improve the piezoelectric performance. Two or more kinds of other perovskite-type crystals may be used.

The (Bi, Na) $TiO_3$—$BaTiO_3$ layer 15 may be typically formed by a sputtering method. For example, the (Bi, Na) $TiO_3$—$BaTiO_3$ layer 15 may also be formed by another thin film forming method, such as a PLD method, a CVD method, a sol-gel method, or an AD method.

An example of the material of the second electrode layer 17 is a metal having a low electric resistance. Other examples of the material of the second electrode layer 17 include oxide conductors such as NiO, $RuO_2$, $IrO_3$, $SrRuO_3$, and $LaNiO_3$. The second electrode layer 17 may be composed of two or more kinds of these materials.

A metal layer may be interposed between the second electrode layer 17 and the (Bi, Na)$TiO_3$—$BaTiO_3$ layer 15 to improve the adhesion therebetween. Examples of the material of the metal layer include titanium, tantalum, iron, cobalt, nickel, and chrome. Two or more kinds of metals may be used.

Figure 1B:
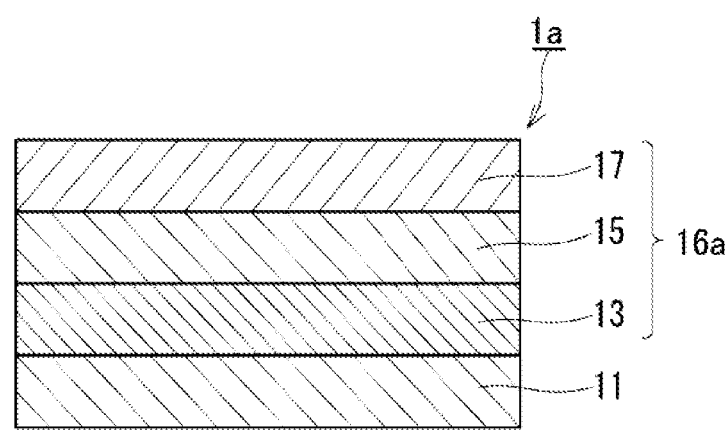
FIG. 1B shows a variation of the piezoelectric film shown in FIG. 1A.

FIG. 1B shows a variation of the piezoelectric film shown in FIG. 1A. As shown in FIG. 1B, a multilayer structure 16b further comprises a substrate 11. The $Na_xM_{1-x}$ layer 13 is formed on the substrate 11.

Examples of the substrate 11 are described below:
a silicon substrate;
an oxide substrate having a sodium chloride structure such as a MgO substrate,
an oxide substrate having a perovskite-type structure such as a $SrTiO_3$ substrate, a $LaAlO_3$ substrate, or a $NdGaO_3$ substrate;
an oxide substrate having a corundum-type structure such as a $Al_2O_3$ substrate;
an oxide substrate having a spinel-type structure such as a $MgAlO_2O_4$ substrate;
an oxide substrate having a rutile-type structure such as a $TiO_2$ substrate; and an oxide substrate having a crystal structure of cubic system such as a (La, Sr) (Al, Ta) O$_3$ substrate or an yttria-stabilized zirconia (YSZ) substrate.

Desirably, a silicon monocrystalline substrate or a MgO monocrystalline substrate may be used.

An interlayer may be formed on the surface of the substrate 11 by an epitaxial growth method. An example of the material of the interlayer is yttria-stabilized zirconia (YSZ).

Other examples of the material of the interlayer are described below:

materials having a fluorite-type structure such as CeO$_2$, materials having a sodium chloride structure such as MgO, BaO, SrO, TiN, and ZrN, materials having a perovskite-type structure such as SrTiO$_3$, LaAlO$_3$, (La, Sr) MnO$_3$, and (La, Sr) CoO$_3$; and materials having a spinel-type structure such as γ-Al$_2$O$_3$ and MgAl$_2$O$_4$.

Two or more kinds of these materials may be used. As one example, the substrate 11 may be a laminate of CeO$_2$/YSZ/Si.

A metal layer is interposed between the substrate 11 and the Na$_x$M$_{1-x}$ layer 13 to improve the adhesion therebetween. Examples of the material of the metal layer include Ti, Ta, Fe, Co, Ni, and Cr. Ti is desirable.

EXAMPLES

The following examples describe the present invention in more detail.

The examples are composed of the example A, the example B, and the example C. The example A, the example B, and the example C correspond to the (001) orientation, the (110) orientation, and the (111) orientation, respectively.

The example A is composed of the example A1—the example A9 and the comparative example A1—the comparative example A4.

The example B is composed of the example B1—the example B6 and the comparative example B1—the comparative example B2.

The example C is composed of the example C1—the example C6 and the comparative example C1—the comparative example C2.

Example A1

A piezoelectric film shown in FIG. 1B was prepared as below.

First, a Na$_x$M$_{1-x}$ (x=0.01, M=Pt) layer 13 having a (001) orientation only was formed on a MgO (001) monocrystalline substrate 11 by a sputtering method. The Na$_x$M$_{1-x}$ (x=0.01, M=Pt) layer 13 had a thickness of 250 nanometers. The condition of the sputtering method is described below:

Target: Same composition as above
Gas atmosphere: Argon
RF power: 15 W
Substrate temperature: 300 degrees Celsius The formed Na$_x$M$_{1-x}$ (x=0.01, M=Pt) layer 13 was subjected to an X-ray diffraction analysis (XRD). As a result, it was observed that the Na$_x$Pt$_{1-x}$ layer 13 had a (001) orientation only.

The composition of the Na$_x$M$_{1-x}$ (x=0.01, M=Pt) layer 13 was analyzed by an energy dispersive X-ray spectroscopy (SEM-EDX). It was confirmed that the composition of Na and Pt contained in the Na$_x$Pt$_{1-x}$ layer 13 was the same as the composition of the target.

The (Bi, Na) TiO$_3$—BaTiO$_3$ layer 15 having a (001) orientation only was formed on the Na$_x$M$_{1-x}$ (x=0.01, M=Pt) layer 13 by a sputtering method. The condition of the sputtering method is described below.

Target: Same composition as above
Gas flow ratio: Argon/Oxygen
RF power: 170 W
Substrate temperature: 650 degrees Celsius The formed (Na, Bi) TiO$_3$—BaTiO$_3$ layer 15 had a composition around Morphotropic Phase Boundary. The formed (Na, Bi) TiO$_3$—BaTiO$_3$ layer 15 had a thickness of 2.7 micrometers.

The composition of the formed (Na, Bi) TiO$_3$—BaTiO$_3$ layer 15 was analyzed by an energy dispersive X-ray spectroscopy (SEM-EDX). It was confirmed that the composition of Na, Bi, Ba, and Ti contained in the formed (Na, Bi) TiO$_3$—BaTiO$_3$ layer 15 was the same as the composition of the target.

Finally, a gold layer having a thickness of 100 nanometers was formed on the (Na, Bi) TiO$_3$—BaTiO$_3$ layer 15 by an evaporation method. The gold layer serves as the second electrode layer 17. In this way, a piezoelectric film according to the example A1 was obtained.

(X-Ray Diffraction Analysis)

The formed (Na, Bi) TiO$_3$—BaTiO$_3$ layer 15 was subjected to an X-ray diffraction analysis to analyze the crystal structure thereof. The X-ray diffraction analysis was performed by irradiating the (Na, Bi) TiO$_3$—BaTiO$_3$ layer 15 with X-rays.

Figure 2:
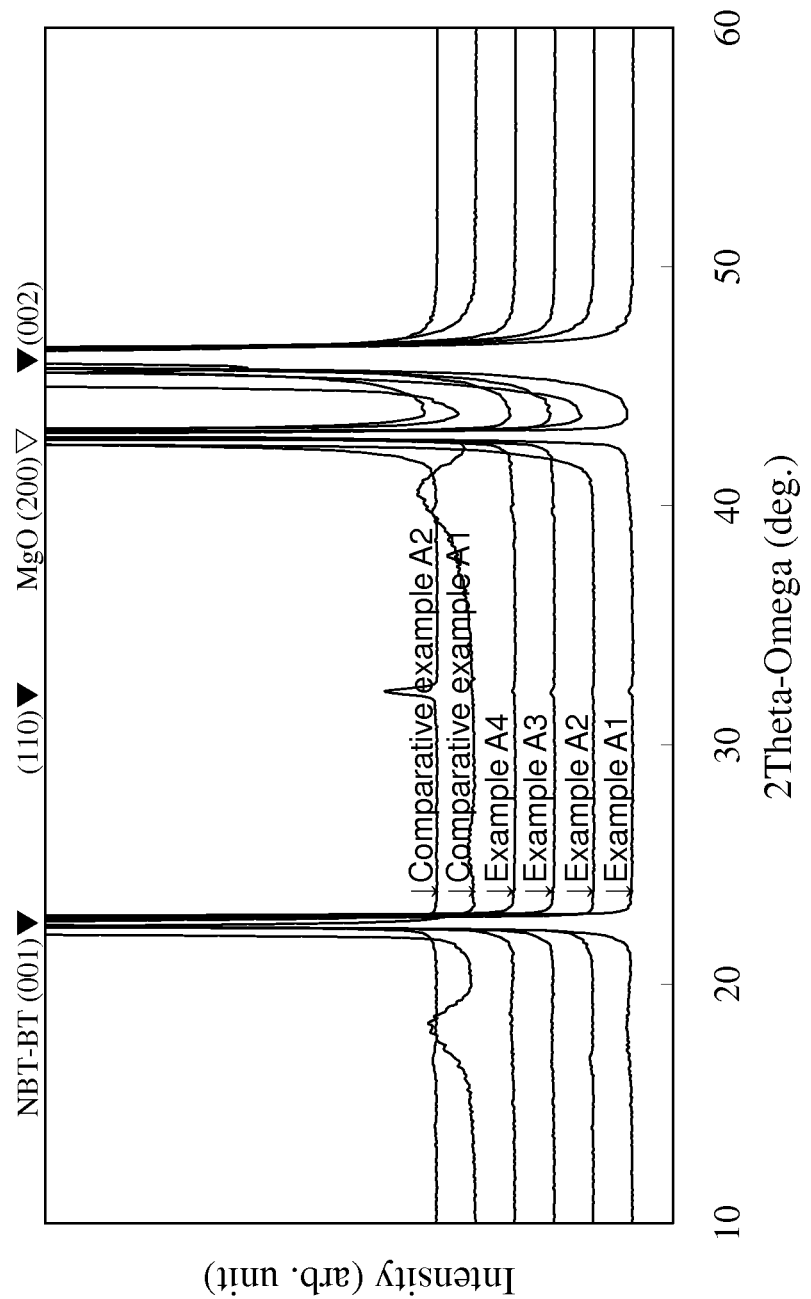
FIG. 2 shows an X-ray diffraction profile of the piezoelectric films according to the example A1—the example A4 and the comparative example A1—the comparative example A2.
Figure 3:
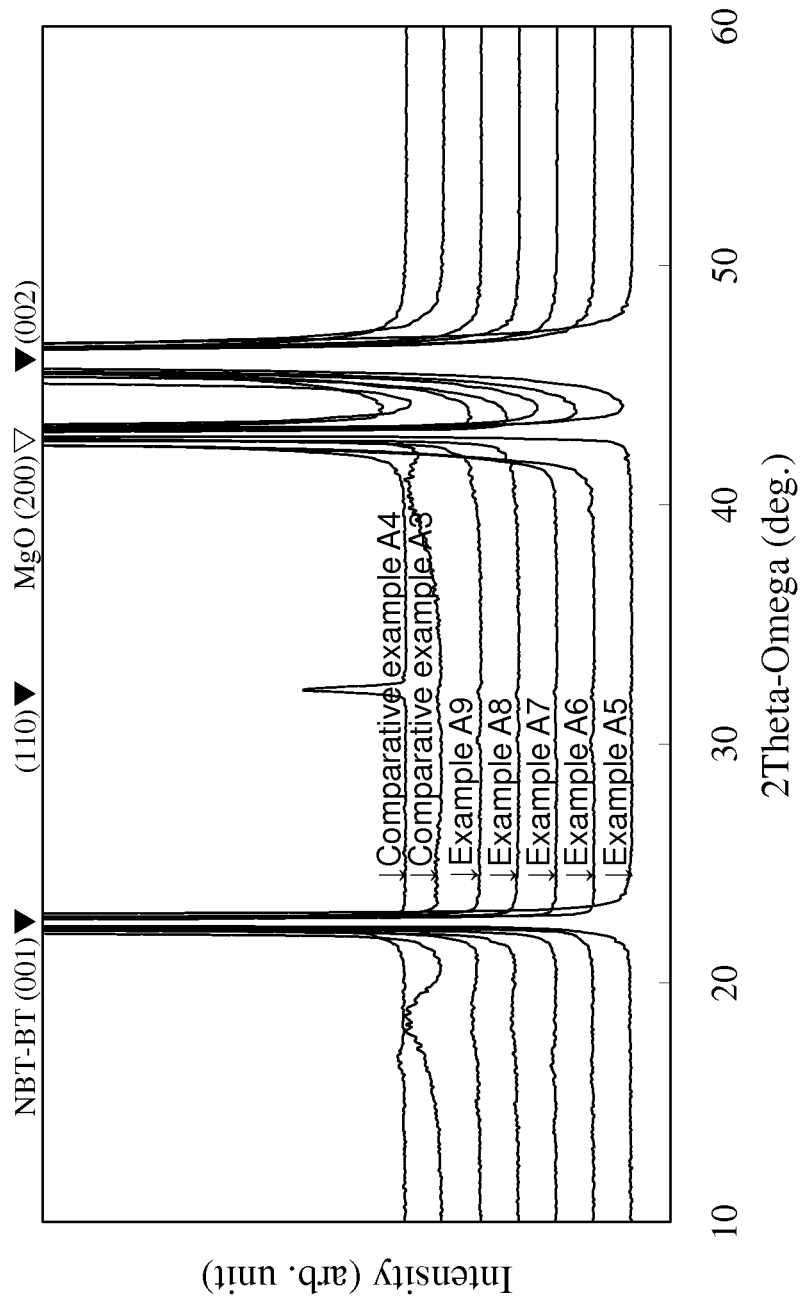
FIG. 3 shows an X-ray diffraction profile of the piezoelectric films according to the example A5—the example A9 and the comparative example A3—the comparative example A4.

FIG. 2 shows the result of the X-ray diffraction, namely, the profile of the X-ray diffraction. In other examples and comparative examples, the same X-ray diffraction method was used. FIG. 2 shows not only the result of the X-ray diffraction of the example A1 but also the results of the X-ray analysis of the example A2—the example A4 and the comparative example A1—the comparative example A2. FIG. 3 shows the results of the X-ray analysis of the example A5—the example A9 and the comparative example A3—the comparative example A4.

As shown in FIG. 2, observed was only the reflection peak derived from the (Na, Bi) TiO$_3$—BaTiO$_3$ layer 15 having a (001) orientation, except for the reflection peaks derived from the MgO (001) monocrystalline substrate 11 and the Na$_x$M$_{1-x}$ (x=0.01, M=Pt) layer 13. The intensity of this (001) reflection peak was a very high value of 139,247 cps. The profile shown in FIG. 2 means that the (Na, Bi) TiO$_3$—BaTiO$_3$ layer 15 according to the example A1 has a significantly high (001) crystalline orientation.

(Measurement of Piezoelectric Constant d$_{31}$)

The piezoelectric performance of the piezoelectric film was evaluated in the following manner. The piezoelectric film was cut into a strip with a width of 2 mm and worked into a cantilever shape. Next, a potential difference was applied between the first electrode 13 and the second electrode layer 17, and the resulting displacement of the cantilever was measured with a laser displacement meter. The measured displacement was converted into a piezoelectric constant d$_{31}$.

The piezoelectric constant d$_{31}$ of the piezoelectric film fabricated in the example A1 was −128 pC/N. The piezoelectric film according to the example A1 had piezoelectric performance superior to the piezoelectric films of the comparative example A1—the comparative example A2, which are described later.

Example A2

An experiment similar to the example A1 was conducted except that x=0.002.

Example A3

An experiment similar to the example A1 was conducted except that x=0.02.

Example A4

An experiment similar to the example A1 was conducted except that manganese was added at a concentration of 0.2 mol % as an additive to the (Na, Bi) TiO$_3$—BaTiO$_3$ layer 15.

Example A5

An experiment similar to the example A1 was conducted except that iridium was used instead of platinum as the metal M of the Na$_x$M$_{1-x}$ layer 13.

Example A6

An experiment similar to the example A1 was conducted except that iridium was used instead of platinum as the metal M of the Na$_x$M$_{1-x}$ layer 13 and except that x=0.002.

Example A7

An experiment similar to the example A1 was conducted except that iridium was used instead of platinum as the metal M of the Na$_x$M$_{1-x}$ layer 13 and except that x=0.02.

Example A8

An experiment similar to the example A1 was conducted except that iridium was used instead of platinum as the metal M of the Na$_x$M$_{1-x}$ layer 13 and except that manganese was added at a concentration of 0.2 mol % as an additive to the (Na, Bi) TiO$_3$—BaTiO$_3$ layer 15.

Example A9

An experiment similar to the example A1 was conducted except that Pt$_{0.5}$Ir$_{0.5}$ was used instead of platinum as the metal M of the Na$_x$M$_{1-x}$ layer 13.

Comparative Example A1

An experiment similar to the example A1 was conducted except that x=0.

Comparative Example A2

An experiment similar to the example A1 was conducted except that x=0.05.

Comparative Example A3

An experiment similar to the example A1 was conducted except that iridium was used instead of platinum as the metal M of the Na$_x$M$_{1-x}$ layer 13 and except that x=0.

Comparative Example A4

An experiment similar to the example A1 was conducted except that iridium was used instead of platinum as the metal M of the Na$_x$M$_{1-x}$ layer 13 and except that x=0.05.

Table 1 shows the results of the example A1—the example A9 and the comparative example A1—the comparative example A4.

TABLE 1

| | Na$_x$M$_{1-x}$ layer | | | (Na, Bi)TiO$_3$—BaTiO$_3$ layer | | |
| --- | --- | --- | --- | --- | --- | --- |
| | M | Value of x | Additive | (001) orientation only? | (001) orientation intensity | Piezoelectric constant d$_{31}$ |
| Example A1 | Pt | 0.01 | none | Yes | 139,247 cps | −128 pc/N |
| Example A2 | Pt | 0.002 | none | Yes | 80,844 cps | −94 pc/N |
| Example A3 | Pt | 0.02 | none | Yes | 105,250 cps | −112 pC/N |
| Example A4 | Pt | 0.01 | Mn | Yes | 110,541 cps | −141 pc/N |
| Example A5 | Ir | 0.01 | none | Yes | 101,681 cps | −121 pC/N |
| Example A6 | Ir | 0.002 | none | Yes | 51,402 cps | −86 pC/N |
| Example A7 | Ir | 0.02 | none | Yes | 69,055 cps | −98 pC/N |
| Example A8 | Ir | 0.01 | Mn | Yes | 76,875 cps | −136 pC/N |
| Example A9 | Pt$_{0.5}$Ir$_{0.5}$ | 0.01 | none | Yes | 100,930 cps | −123 pC/N |
| Comparative example A1 | Pt | 0 | none | No | 30,893 cps | −44 pc/N |
| Comparative example A2 | Pt | 0.05 | none | No | 54,744 cps | −78 pC/N |
| Comparative example A3 | Ir | 0 | none | No | 23,949 cps | −41 pC/N |
| Comparative example A4 | Ir | 0.05 | none | No | 39,617 cps | −67 pC/N |

As is clear from Table 1, the (Na, Bi) TiO$_3$—BaTiO$_3$ layer 15 has a high (001) crystalline orientation and a high piezoelectric constant, when the value of x falls within the range of not less than 0.002 and not more than 0.02.

As is clear from the example A2, the example A6, the comparative example A1, and the comparative example A3, it is necessary that the value of x is not less than 0.002.

As is clear from the example A3, the example A7, the comparative example A2, and the comparative example A4, it is necessary that the value of x is not more than 0.02.

Example B1

A piezoelectric film shown in FIG. 1B was prepared as below.

First, a Na$_x$M$_{1-x}$ (x=0.01, M=Pt) layer 13 having a (110) orientation only was formed on a MgO (110) monocrystalline substrate 11 by a sputtering method. The Na$_x$M$_{1-x}$ (x=0.01, M=Pt) layer 13 had a thickness of 250 nanometers. The condition of the sputtering method is described below:
  Target: Same composition as above
  Gas atmosphere: Argon
  RF power: 15 W
  Substrate temperature: 300 degrees Celsius The formed Na$_x$M$_{1-x}$ layer 13 was subjected to an X-ray diffraction analysis (XRD). As a result, it was observed that the Na$_x$M$_{1-x}$ layer 13 had a (110) orientation only.

The composition of the Na$_x$M$_{1-x}$ layer 13 was analyzed by an energy dispersive X-ray spectroscopy (SEM-EDX). It was confirmed that the composition of Na and M contained in the Na$_x$M$_{1-x}$ layer 13 was the same as the composition of the target.

The (Bi, Na) TiO$_3$—BaTiO$_3$ layer 15 having a (110) orientation only was formed by a sputtering method. The condition of the sputtering method is described below.
  Target: Same composition as above
  Gas atmosphere: Argon/Oxygen
  RF power: 170 W
  Substrate temperature: 650 degrees Celsius The formed (Na, Bi) TiO$_3$—BaTiO$_3$ layer 15 had a composition around Morphotropic Phase Boundary. The formed (Na, Bi) TiO$_3$—BaTiO$_3$ layer 15 had a thickness of 2.7 micrometers.

The composition of the formed (Na, Bi) TiO$_3$—BaTiO$_3$ layer 15 was analyzed by an energy dispersive X-ray spectroscopy (SEM-EDX). It was confirmed that the composition of Na, Bi, Ba, and Ti contained in the formed (Na, Bi) TiO$_3$—BaTiO$_3$ layer 15 was the same as the composition of the target.

Finally, a gold layer having a thickness of 100 nanometers was formed on the (Na, Bi) TiO$_3$—BaTiO$_3$ layer 15 by an evaporation method. The gold layer serves as the second electrode layer 17. In this way, a piezoelectric film according to the example B1 was obtained.

(X-Ray Diffraction Analysis)

The formed (Na, Bi) TiO$_3$—BaTiO$_3$ layer 15 was subjected to an X-ray diffraction analysis to analyze the crystal structure thereof. The X-ray diffraction analysis was performed by irradiating the (Na, Bi) TiO$_3$—BaTiO$_3$ layer 15 with X-rays.

Figure 4:
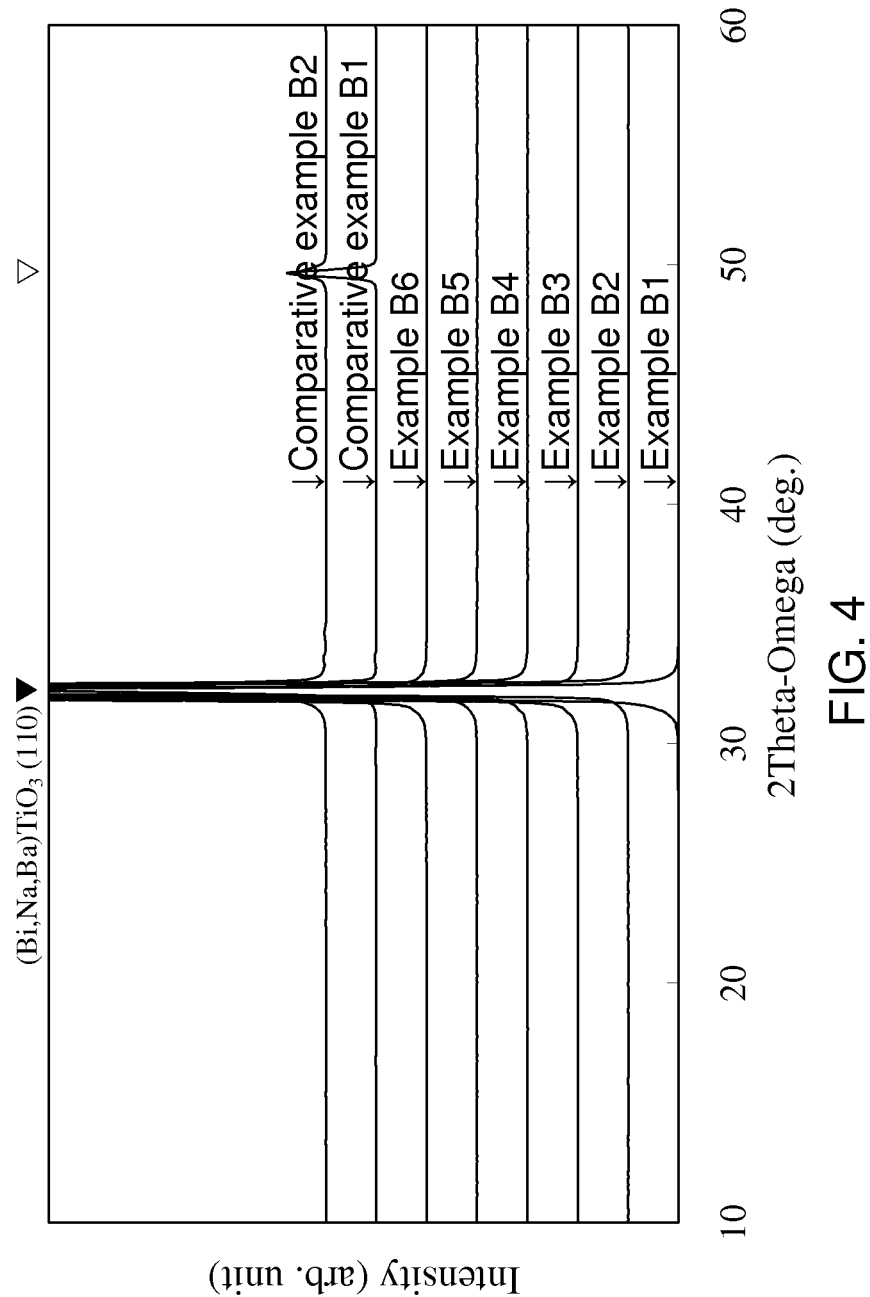
FIG. 4 shows an X-ray diffraction profile of the piezoelectric films according to the example B1—the example B6 and the comparative example B1—the comparative example B2.

FIG. 4 shows the result of the X-ray diffraction, namely, the profile of the X-ray diffraction. In other examples and comparative examples, the same X-ray diffraction method was used. FIG. 4 shows not only the result of the X-ray diffraction of the example B1 but also the results of the X-ray analysis of the example B2—the example B6 and the comparative example B1—the comparative example B2.

As shown in FIG. 4, observed was only the reflection peak derived from the (Na, Bi) TiO$_3$—BaTiO$_3$ layer 15 having a (110) orientation, except for the reflection peaks derived from the MgO (110) monocrystalline substrate 11 and the Na$_x$M$_{1-x}$ layer 13. The intensity of this (110) reflection peak was a very high value of 1,110,811 cps. The profile shown in FIG. 2 means that the (Na, Bi) TiO$_3$—BaTiO$_3$ layer 15 according to the example 1 has a significantly high (110) crystalline orientation.

(Measurement of Piezoelectric Constant d$_{31}$)

The piezoelectric performance of the piezoelectric film was evaluated in the following manner. The piezoelectric film was cut into a strip with a width of 2 mm and worked into a cantilever shape. Next, a potential difference was applied between the first electrode 13 and the second electrode layer 17, and the resulting displacement of the cantilever was measured with a laser displacement meter. The measured displacement was converted into a piezoelectric constant d$_{31}$.

The piezoelectric constant d$_{31}$ of the piezoelectric film fabricated in the example B1 was −171 pC/N. The piezoelectric film according to the example 1 had piezoelectric performance superior to the piezoelectric films of the comparative example B1—the comparative example B2, which are described later.

Example B2

An experiment similar to the example B1 was conducted except that x=0.002.

Example B3

An experiment similar to the example B1 was conducted except that x=0.02.

Example B4

An experiment similar to the example B1 was conducted except that manganese was added at a concentration of 0.2 mol % as an additive to the (Na, Bi) TiO$_3$—BaTiO$_3$ layer 15.

Example B5

An experiment similar to the example B1 was conducted except that the metal M of the Na$_x$M$_{1-x}$ layer 13 was iridium.

Example B6

An experiment similar to the example B1 was conducted except that the metal M of the Na$_x$M$_{1-x}$ layer 13 was Ir$_{0.5}$Pt$_{0.5}$.

Comparative Example B1

An experiment similar to the example 1 was conducted except that x=0.

Comparative Example B2

An experiment similar to the example 1 was conducted except that x=0.05.

Table 2 shows the results of the example B1—the example B6 and the comparative example B1—the comparative example B2.

TABLE 2

| | Na$_x$M$_{1-x}$ layer | | | (Na, Bi)TiO$_3$—BaTiO$_3$ layer | |
|---|---|---|---|---|---|
| | M | Value of x | Additive | (110) Orientation intensity | Piezoelectric constant d$_{31}$ |
| Example B1 | Pt | 0.01 | none | 1,110,811 cps | −171 pC/N |
| Example B2 | Pt | 0.002 | none | 458,194 cps | −139 pC/N |
| Example B3 | Pt | 0.02 | none | 523,511 cps | −145 pC/N |
| Example B4 | Pt | 0.01 | Mn | 562,893 cps | −216 pC/N |
| Example B5 | Ir | 0.01 | none | 889,564 cps | −149 pC/N |
| Example B6 | Ir$_{0.5}$Pt$_{0.5}$ | 0.01 | none | 993,301 cps | −157 pC/N |
| Comparative example B1 | Pt | 0 | none | 71,534 cps | −68 pC/N |
| Comparative example B2 | Pt | 0.05 | none | 91,872 cps | −70 pC/N |

Similarly to the example A, as is clear from Table 2, the (Na, Bi) TiO$_3$—BaTiO$_3$ layer 15 has a high (110) crystalline orientation and a high piezoelectric constant, when the value of x falls within the range of not less than 0.002 and not more than 0.02.

Example C

An experiment similar to the example B was conducted except that a MgO (111) monocrystalline substrate 11 was used instead of the MgO (110) monocrystalline substrate 11. In the example C, the Na$_x$M$_{1-x}$ layer 13 having a (111) orientation only was formed on the MgO (111) monocrystalline substrate 11. A (Na, Bi) TiO$_3$—BaTiO$_3$ layer 15 having a (111) orientation only was formed on this Na$_x$M$_{1-x}$ layer 13.

Figure 5:
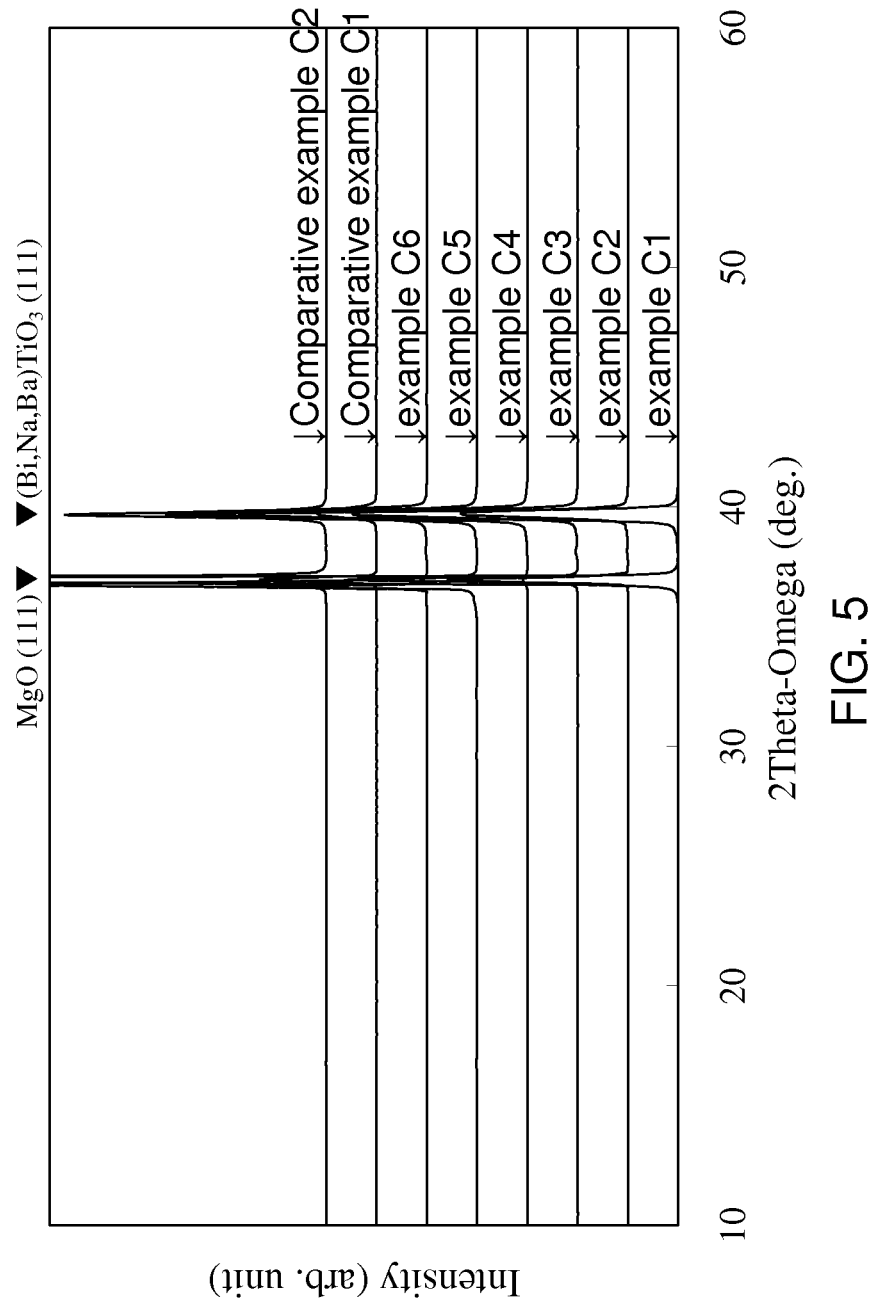
FIG. 5 shows an X-ray diffraction profile of the piezoelectric films according to the example C1—the example C6 and the comparative example C1—the comparative example C2.

Table 3 shows the results of the example C, which is composed of the example C1—the example C6 and the comparative example C1—the comparative example C2. FIG. 5 shows the result of the X-ray diffraction of the example C1—the example C6 and the comparative example C1—the comparative example C2.

TABLE 3

| | Na$_x$M$_{1-x}$ layer | | | (Na, Bi)TiO$_3$—BaTiO$_3$ layer | |
|---|---|---|---|---|---|
| | M | Value of x | Additive | (111) Orientation intensity | Piezoelectric constant d$_{31}$ |
| Example C1 | Pt | 0.01 | none | 78,963 cps | −139 pC/N |
| Example C2 | Pt | 0.002 | none | 25,813 cps | −121 pC/N |
| Example C3 | Pt | 0.02 | none | 34,486 cps | −124 pC/N |
| Example C4 | Pt | 0.01 | Mn | 63,559 cps | −172 pC/N |
| Example C5 | Ir | 0.01 | none | 46,778 cps | −125 pC/N |
| Example C6 | Ir$_{0.5}$Pt$_{0.5}$ | 0.01 | none | 59,317 cps | −132 pC/N |
| Comparative example C1 | Pt | 0 | none | 9,839 cps | −59 pC/N |
| Comparative example C2 | Pt | 0.05 | none | 14,565 cps | −63 pC/N |

Similarly to the example A, as is clear from Table 3, the (Na, Bi) TiO$_3$—BaTiO$_3$ layer 15 has a high (111) crystalline orientation and a high piezoelectric constant, when the value of x falls within the range of not less than 0.002 and not more than 0.02.

The ink jet head, the angular velocity sensor, and the piezoelectric generating element each comprising the above-mentioned piezoelectric film are described. For more detail, see International publication No. 2010/047049. U.S. Pat. No. 7,870,787 and Chinese Laid-open patent application publication No. 101981718 are the United States patent publication and the Chinese laid-open patent application publication which correspond to International publication No. 2010/047049, respectively.

(Ink Jet Head)

An ink jet head of the present invention will be described below with reference to FIG. 3 to FIG. 5.

FIG. 3 shows one embodiment of the ink jet head of the present invention. FIG. 4 is an exploded view showing main parts including a pressure chamber member and an actuator part in an ink jet head 100 shown in FIG. 3.

A reference character A in FIG. 3 and FIG. 4 indicates a pressure chamber member. The pressure chamber member A includes through-holes 101 that penetrate therethrough in its thickness direction (in the upward and downward directions in these diagrams). The through-hole 101 shown in FIG. 4 is a part of the through-hole 101 in the cross section in the thickness direction of the pressure chamber member A. A reference character B indicates an actuator part including piezoelectric films and vibration layers. A reference character C indicates an ink passage member C including common liquid chambers 105 and ink passages 107. The pressure chamber member A, the actuator part B, and the ink passage member C are bonded to each other so that the pressure chamber member A is sandwiched between the actuator part B and the ink passage member C. When the pressure chamber member A, the actuator part B, and the ink passage member C are bonded to each other, each of the through-holes 101 forms a pressure chamber 102 for storing ink supplied from the common liquid chamber 105.

The actuator part B has piezoelectric films and vibration layers that are aligned over the corresponding pressure chambers 102 respectively in plan view. In FIG. 3 and FIG. 4, a reference numeral 103 indicates an individual electrode layer that is a part of the piezoelectric film. As shown in FIG. 3, in the ink jet head 100, a plurality of individual electrode layers 103, that is, piezoelectric films are arranged in a zigzag pattern in plan view.

The ink passage member C has the common liquid chambers 105 arranged in stripes in plan view. In FIG. 3 and FIG. 4, each of the common liquid chambers 105 is aligned over a plurality of pressure chambers 102 in plan view. The common liquid chambers 105 extend in the ink supply direction (in the direction indicated by arrows in FIG. 3) in the ink jet head 100. The ink passage member C has supply ports 106, each of which supplies the ink in the common liquid chamber 105 to one of the pressure chambers 102, and ink passages 107, each of which ejects the ink in the corresponding pressure chamber 102 through the corresponding nozzle hole 108. Usually, one pressure chamber 102 has one supply port 106 and one nozzle hole 108. The nozzle holes 108 are formed in a nozzle plate D. The nozzle plate D is bonded to the ink passage member C so that the nozzle plate D and the pressure chamber member A sandwich the ink passage member C therebetween.

In FIG. 3, a reference character E indicates an IC chip. The IC chip E is connected electrically to the individual electrode layers 103, which are exposed on the surface of the actuator part B, through bonding wires BW. For simplicity of FIG. 3, only a part of the bonding wires BW are shown in FIG. 3.

FIG. 4 shows the configuration of the main parts including the pressure chamber member A and the actuator part B. FIG. 5 shows the cross section perpendicular to the ink supply direction (in the direction indicated by the arrows in FIG. 3) in the pressure chamber member A and the actuator part B. The actuator part B includes piezoelectric films 104 (104a to 104d) each having the piezoelectric layer 15 sandwiched between the first electrode (the individual electrode layer 103) and the second electrode (the common electrode layer 112). The individual electrode layers 103 correspond one to one to the piezoelectric films 104a to 104d. The common electrode layer 112 is a single layer electrode that is common to the piezoelectric films 104a to 104d.

As surrounded by the dashed-line in FIG. 5, the above-mentioned piezoelectric films 104 are arranged in the ink jet head. The piezoelectric film is the piezoelectric film described in the item titled as "Piezoelectric film".

(Image Forming Method by Ink Jet Head)

The image forming method for the present invention includes, in the above-described ink jet head of the present invention, a step of applying a voltage to the piezoelectric layer through the first and second electrodes (that is, the individual electrode layer and the common electrode layer) to displace, based on the piezoelectric effect, the vibration layer in its film thickness direction so that the volumetric capacity of the pressure chamber changes; and a step of ejecting the ink from the pressure chamber by the displacement.

The voltage to be applied to the piezoelectric layer is changed with the relative position between the ink jet head and an object like a sheet of paper, on which an image is to be formed, being changed, so as to control the timing of ink ejection from the ink jet head and the amount of ink ejected therefrom. As a result, an image is formed on the surface of the object. The term "image" used in the present description includes a character. In other words, according to the present method for forming an image, a letter, a picture, or a figure is printed to a print target such as a sheet of paper. With this method, a picturesque image can be printed.

(Angular Velocity Sensor)

Figure 6:
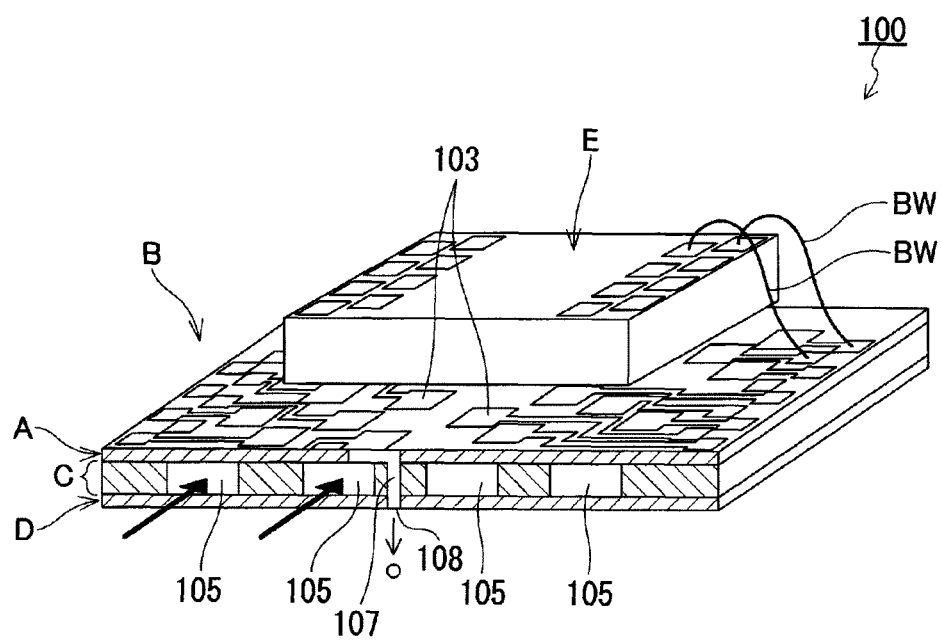
FIG. 6 is a perspective view schematically showing an example of an ink jet head of the present invention and partially showing a cross section of the ink jet head.
Figure 7:
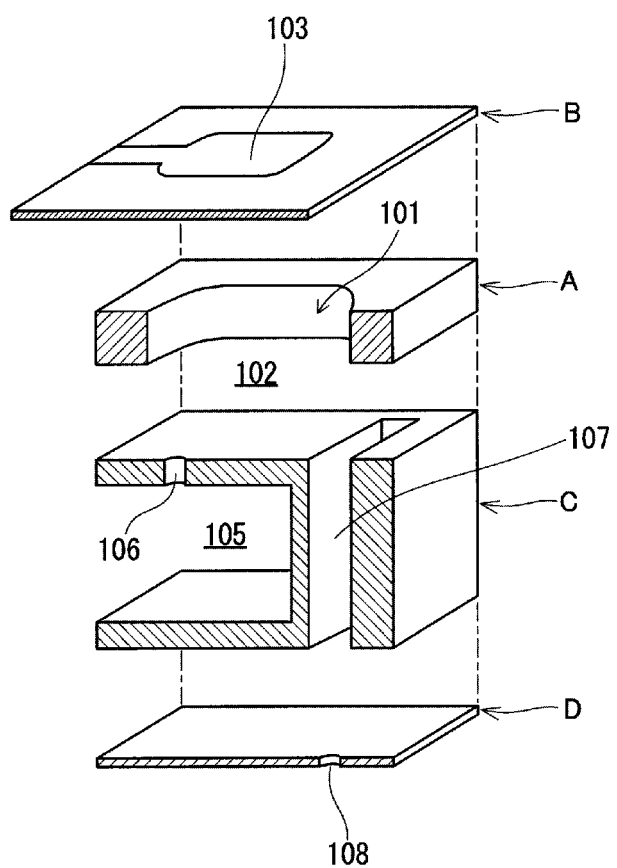
FIG. 7 is an exploded perspective view schematically showing main parts including a pressure chamber member and an actuator part in the ink jet head shown in FIG. 6 and partially showing a cross section of the main parts.

FIG. 6 shows examples of an angular velocity sensor of the present invention. FIG. 7 shows a cross section E1 of an angular velocity sensor 21a shown in FIG. 6. The angular velocity sensor 21a shown in FIG. 6 is a so-called tuning-fork type angular velocity sensor. This type of angular velocity sensor can be used in a navigation apparatus for a vehicle, and as a sensor for correcting image blurring due to hand movement in a digital still camera.

The angular velocity sensor 21a shown in FIG. 6 includes a substrate 200 having vibration parts 200b and piezoelectric films 208 bonded to the vibration parts 200b.

The substrate 200 has a stationary part 200a and a pair of arms (vibration parts 200b) extending in a predetermined direction from the stationary part 200a. The direction in which the vibration parts 200b extend is the same as the direction in which the central axis of rotation L of the angular velocity detected by the angular velocity sensor 21 extends. Particularly, it is the Y direction in FIG. 5. The substrate 200 has a shape of a tuning fork including two arms (vibration parts 200b), when viewed from the thickness direction of the substrate 200 (the Z direction in FIG. 5).

The material of the substrate 200 is not limited. The material is, for example, Si, glass, ceramic, or metal. A monocrystalline Si substrate can be used as the substrate 200. The thickness of the substrate 200 is not limited as long as the functions of the angular velocity sensor 21a can develop. More particularly, the substrate 200 has a thickness of at least 0.1 mm but not more than 0.8 mm. The thickness of the stationary part 200a can be different from that of the vibration part 200b.

The piezoelectric film 208 is bonded to the vibration part 200b. The piezoelectric film 208 is the piezoelectric layer described in the item titled as "Piezoelectric film". As shown in FIG. 6 and FIG. 7, the piezoelectric film 208 comprises the first electrode 13 (202), the piezoelectric layer 15, and the second electric layer 17 (205).

The second electrode 205 has an electrode group including a drive electrode 206 and a sense electrode 207. The drive electrode 206 applies a driving voltage that oscillates the vibration part 200b to the piezoelectric layer 15. The sense electrode 207 measures a deformation of the vibration part 200b caused by an angular velocity applied to the vibration part 200b. That is, the vibration part 200b usually oscillates in the width direction thereof (the X direction in FIG. 6). More particularly, in the angular velocity sensor shown in FIG. 6, a pair of drive electrodes 206 are provided on both of the width-direction edge portions of the vibration part 200b along the length direction thereof (the Y direction in FIG. 6). Only one drive electrode 206 may be provided on one of the width-direction edge portions of the vibration part 200b. In the angular velocity sensor shown in FIG. 6, the sense electrode 207 is provided along the length direction of the vibration part 200b and sandwiched between the pair of drive electrodes 206. A plurality of sense electrodes 207 may be provided on the vibration part 200b. The deformation of the vibration part 200b measured by the sense electrode 207 usually is a deflection in the thickness direction thereof (the Z direction in FIG. 6).

In the angular velocity sensor of the present invention, one of the first electrode and the second electrode selected therefrom can be composed of an electrode group including the drive electrode and the sense electrode. In the angular velocity sensor 21a shown in FIG. 6, the second electrode 205 is composed of the electrode group. Unlike this angular velocity sensor, the first electrode 202 can be composed of the electrode group.

The first electrode 202, the drive electrode 206, and the sense electrode 207 have connection terminals 202a, 206a, and 207a, respectively, formed at the end portions thereof. The shape and position of each of the connection terminals are not limited. In FIG. 6, the connection terminals are provided on the stationary part 200a.

In the angular velocity sensor shown in FIG. 6, the piezoelectric film 208 is bonded to both the vibration part 200b and the stationary part 200a. The bonding state of the piezoelectric film 208 is not limited as long as the piezoelectric film 208 can oscillate the vibration part 200b and measure the deformation of the vibration part 200b. For example, the piezoelectric film 208 may be bonded only to the vibration part 200b.

The angular velocity sensor of the present invention may have two or more vibration part groups each consisting of a pair of vibration parts 200b. Such an angular velocity sensor can serve as a biaxial or triaxial angular velocity sensor capable of measuring angular velocities with respect to a plurality central axes of rotation. The angular velocity sensor shown in FIG. 6 has one vibration part group consisting of a pair of vibration parts 200b.

(Method for Measuring Angular Velocity by Angular Velocity Sensor)

The angular velocity measuring method for the present invention uses the angular velocity sensor of the present invention, and includes the steps of: applying a driving voltage to the piezoelectric layer to oscillate the vibration part of the substrate; and measuring a deformation of the vibration part caused by an angular velocity applied to the oscillating vibration part to obtain a value of the applied angular velocity. The driving voltage is applied between the drive electrode and one of the first electrode and the second electrode (the other electrode) that serves neither as the drive electrode nor as the sense electrode, and thus the driving voltage is applied to the piezoelectric layer. The sense electrode and the other electrode measure the deformation of the oscillating vibration part caused by the angular velocity.

Hereinafter, the angular velocity measuring method by the angular velocity sensor 21a shown in FIG. 6 is described. A driving voltage having a frequency that resonates with the natural vibration of the vibration part 200b is applied to the piezoelectric layer 15 through the first electrode 202 and the drive electrode 206 so as to oscillate the vibration part 200b. The driving voltage can be applied, for example, by grounding the first electrode 202 and changing the potential of the driving electrode 206 (in other words, the driving voltage is the potential difference between the first electrode 202 and the driving electrode 206). The angular velocity sensor 21a includes a pair of vibration parts 200b that are arranged in the form of the tuning fork. Usually, reverse (positive and negative) voltages are applied to the drive electrodes 206 provided on the respective vibration parts 200b of the pair. This allows the respective vibration parts 200b to oscillate in the mode in which they vibrate in the directions opposite to each other (the mode in which they vibrate symmetrically with respect to the central axis of rotation L shown in FIG. 6). In the angular velocity sensors 21a shown in FIG. 6, the vibration parts 200b oscillate in their width direction (the X direction). The angular velocity can be measured by oscillating only one of the pair of vibration parts 200b. For accurate measurement, however, it is preferable to oscillate both of the vibration parts 200b in the mode in which they vibrate in the directions opposite to each other.

When an angular velocity c with respect to the central axis of rotation L is applied to the angular velocity sensor 21a in which the vibration parts 200b are oscillating, the vibration parts 200b are deflected respectively in their thickness direction (the Z direction) by Coriolis force. In the case where the respective vibration parts 200b are oscillating in the opposite direction mode, they are deflected in the opposite directions by the same degree. The piezoelectric layer 15 bonded to the vibration part 200b is also deflected according to this deflection of the vibration part 200b. As a result, a potential difference is generated between the first electrode 202 and the sense electrode 207 in accordance with the deflection of the piezoelectric layer 15, that is, the magnitude of the generated Coriolis force. The angular velocity ω applied to the angular velocity sensor 21a can be measured by measuring the magnitude of the potential difference.

The following relationship between a Coriolis force Fc and an angular velocity ω is true:

$$Fc = 2mv\omega$$

where v is the velocity of the oscillating vibration part 200b in the oscillation direction, and m is the mass of the vibration part 200b. As shown in this equation, the angular velocity ω can be calculated from the Coriolis force Fc.

(Piezoelectric Generating Element)

Figure 8:
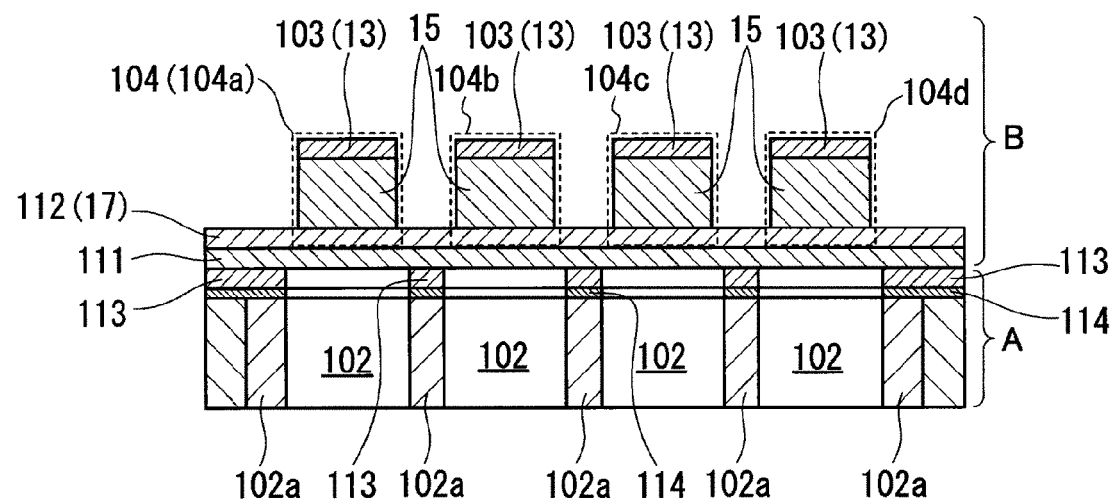
FIG. 8 is a cross-sectional view schematically showing an example of the main parts including the pressure chamber member and the actuator part in the ink jet head shown in FIG. 6.
Figure 9:
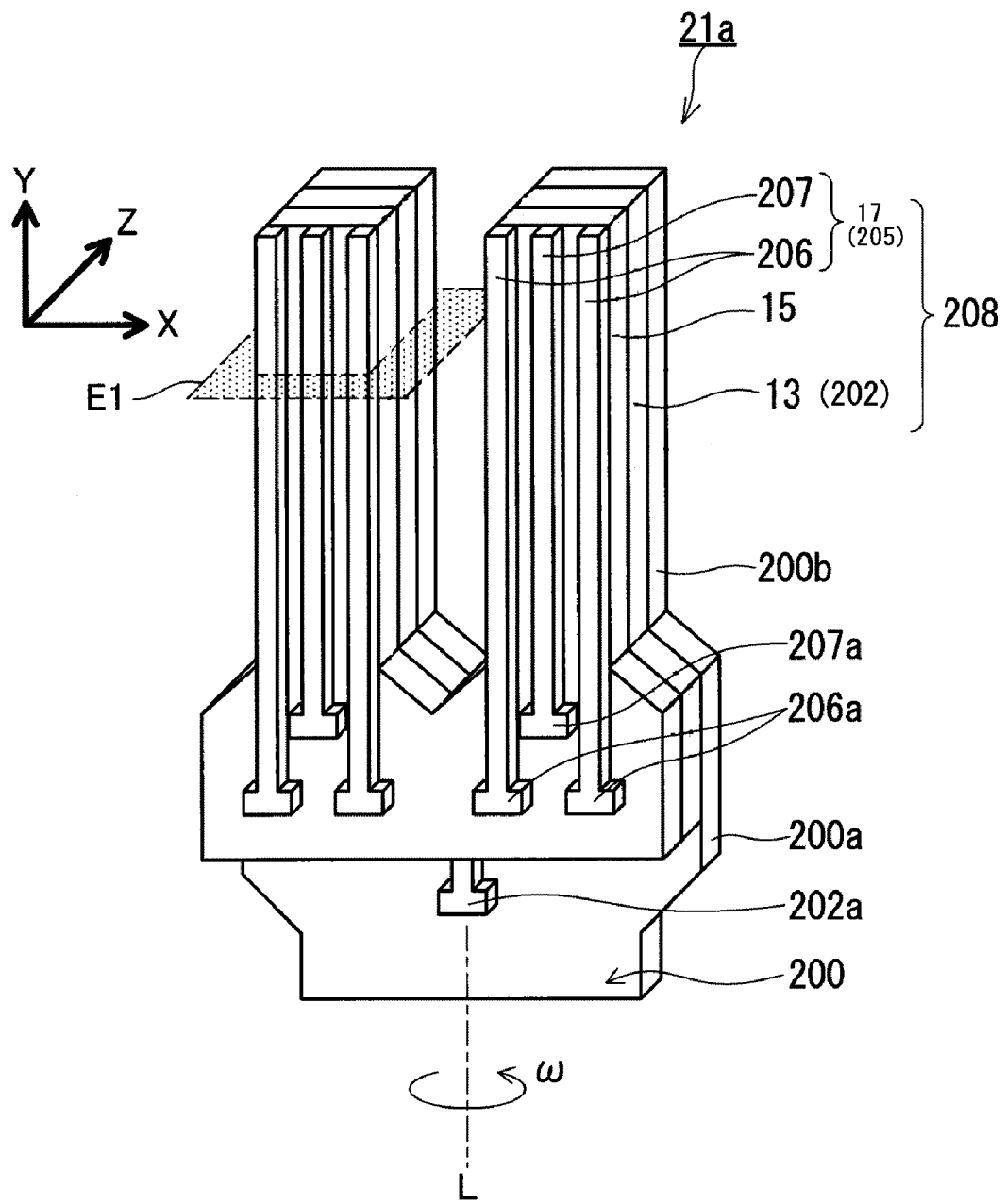
FIG. 9 is a perspective view schematically showing an example of an angular velocity sensor of the present invention.
Figure 10:
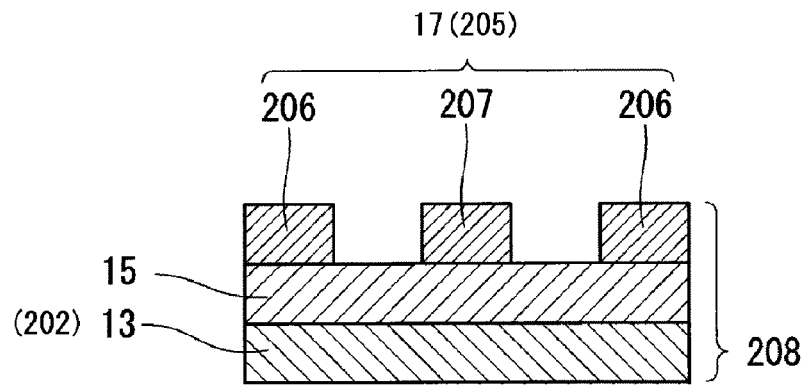
FIG. 10 is a cross-sectional view showing a cross section E1 of the angular velocity sensor shown in FIG. 9.
Figure 11:
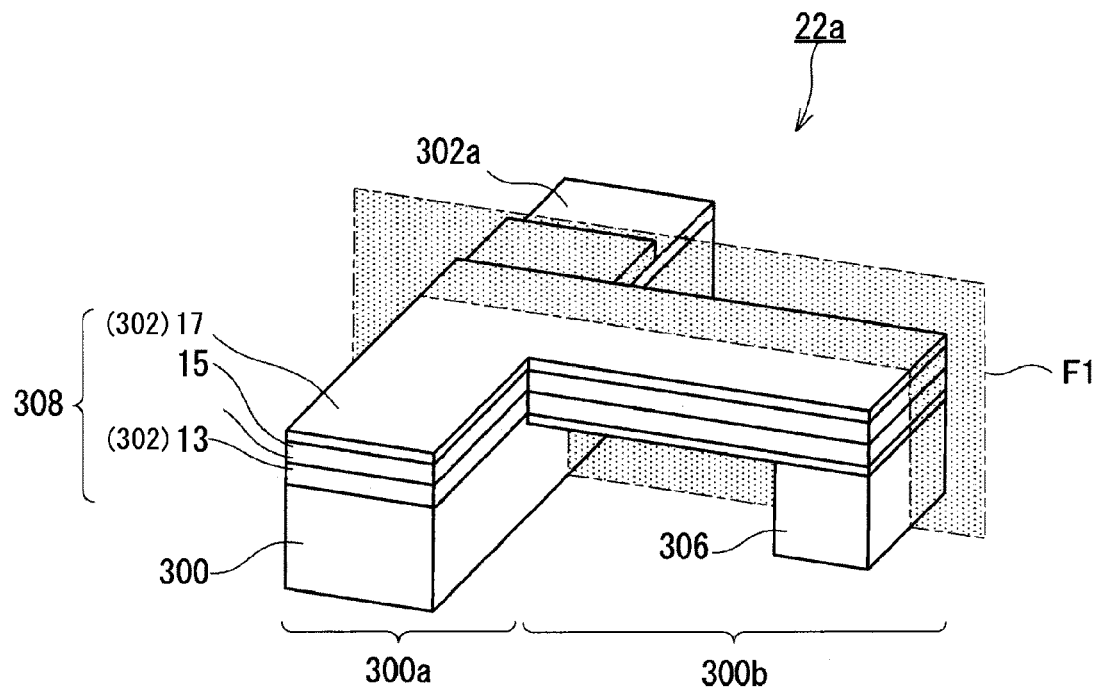
FIG. 11 is a perspective view schematically showing an example of a piezoelectric generating element of the present invention.
Figure 12:
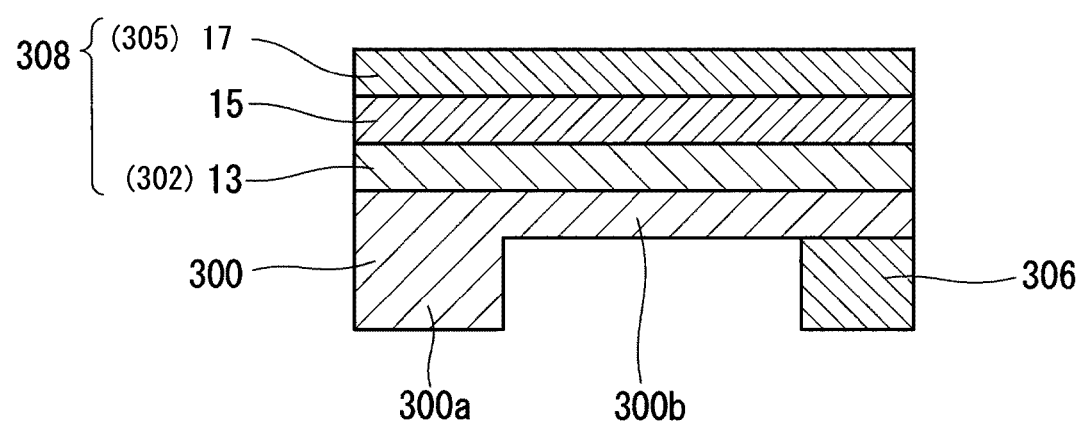
FIG. 12 is a cross-sectional view showing a cross section F1 of the piezoelectric generating element shown in FIG. 11.

FIG. 8 shows an example of the piezoelectric generating element of the present invention. FIG. 9 shows a cross section F1 of a piezoelectric generating element 22a shown in FIG. 8. The piezoelectric generating elements 22a are elements that convert externally-applied mechanical vibration into electrical energy. The piezoelectric generating elements 22a are applied suitably to a self-sustained power supply for generating electric power from various vibrations including engine vibrations and driving vibrations generated in vehicles and machines, and vibrations generated during walking.

The piezoelectric generating element 22a shown in FIG. 8 includes a substrate 300 having a vibration part 300b and a piezoelectric film 308 bonded to the vibration part 300b.

The substrate 300 has a stationary part 300a, and a vibration part 300b having a beam extending in a predetermined direction from the stationary part 300a. The material of the stationary part 300a can be the same as the material of the vibration part 300b. These materials may, however, be different from each other. The stationary part 300a and the vibration part 300b made of materials different from each other may be bonded to each other.

The material of the substrate 300 is not limited. The material is, for example, Si, glass, ceramic, or metal. A monocrystalline Si substrate can be used as the substrate 300. The substrate 300 has a thickness of, for example, at least 0.1 mm but not more than 0.8 mm. The stationary part 300a may have a thickness different from that of the vibration part 300b. The thickness of the vibration part 300b can be adjusted for efficient power generation by changing the resonance frequency of the vibration part 300b.

A weight load 306 is bonded to the vibration part 300b. The weight load 306 adjusts the resonance frequency of the vibration part 300b. The weight load 306 is, for example, a vapor-deposited thin film of Ni. The material, shape, and mass of the weight load 306, as well as the position to which the weight load 306 is bonded can be adjusted according to a desired resonance frequency of the vibration part 300b. The weight load 306 may be omitted. The weight load 306 is not necessary when the resonance frequency of the vibration part 300b is not adjusted.

The piezoelectric film 308 is bonded to the vibration part 300b. The piezoelectric film 308 is the piezoelectric layer described in the item titled as "Piezoelectric film". As shown in FIG. 8 and FIG. 9, the piezoelectric film 308 comprises the first electrode 13 (302), the piezoelectric layer 15, the second electrode 17 (305).

In the piezoelectric generating elements shown in FIG. 8, a part of the first electrode 302 is exposed. This part can serve as a connection terminal 302a.

In the piezoelectric generating element shown in FIG. 8, the piezoelectric film 308 can be bonded to both of the vibration part 300b and the stationary part 300a. The piezoelectric film 308 can be bonded only to the vibration part 300b.

When the piezoelectric generating element of the present invention has a plurality of vibration parts 300b, an increased amount of electric power can be generated. Such a piezoelectric generating element can be applied to mechanical vibrations containing a wide range of frequency components if the plurality of vibration parts 300b have different resonance frequencies.

[Method for Generating Electric Power Using Piezoelectric Generating Element]

The above-described piezoelectric generating element of the present invention is vibrated to obtain electric power through the first electrode and the second electrode.

When mechanical vibration is applied externally to the piezoelectric generating element 22a, the vibration part 300b starts vibrating to produce vertical deflection with respect to the stationary part 300a. The piezoelectric effect produced by this vibration generates an electromotive force across the piezoelectric layer 15. As a result, a potential difference is generated between the first electrode 302 and the second electrode 305 that sandwich the piezoelectric layer 15 therebetween. The higher piezoelectric performance of the piezoelectric layer 15 generates a larger potential difference between the first and second electrodes. Particularly in the case where the resonance frequency of the vibration part 300b is close to the frequency of mechanical vibration to be applied externally to the element, the amplitude of the vibration part 300b increases and thus the electric power generation characteristics are improved. Therefore, the weight load 306 is preferably used to adjust the resonance frequency of the vibration part 300b to be close to the frequency of mechanical vibration applied externally to the element.

INDUSTRIAL APPLICABILITY

The NBT-BT piezoelectric film of the present invention is used for an ink jet head, an angular velocity sensor, and a piezoelectric generating element.

REFERENCE SIGNS LIST

11: substrate
13: $Na_xM_{1-x}$ layer (first electrode)
15: (Bi, Na)TiO$_3$—BaTiO$_3$ layer
17: conductive layer (second electrode)

The invention claimed is:

1. A piezoelectric film comprising:
a $Na_xM_{1-x}$ layer; and
a (Bi, Na)TiO$_3$—BaTiO$_3$ layer; wherein
the (Bi, Na) TiO$_3$—BaTiO$_3$ layer is formed on the $Na_xM_{1-x}$ layer,
M represents Pt, Ir, or PtIr,
x represents a value of not less than 0.002 and not more than 0.02; and
both of the $Na_xM_{1-x}$ layer and the (Bi, Na) TiO$_3$—BaTiO$_3$ layer have a (001) orientation only, a (110) orientation only, or a (111) orientation only.

2. The piezoelectric film according to claim 1, wherein the (Bi, Na) TiO$_3$—BaTiO$_3$ layer is in contact with the $Na_xM_{1-x}$ layer.

3. The piezoelectric film according to claim 1, wherein the (Bi, Na) TiO$_3$—BaTiO$_3$ layer further contains Mn.

* * * * *